(12) United States Patent
Xu et al.

(10) Patent No.: US 12,103,134 B2
(45) Date of Patent: Oct. 1, 2024

(54) WAFER LOADING BRACKET, WAFER LOADING SYSTEM, AND WAFER MOUNTING METHOD FOR CMP PROCESS

(71) Applicant: HANGZHOU ZHONGGUI ELECTRONIC TECHNOLOGY CO., LTD, Zhejiang (CN)

(72) Inventors: Hui Xu, Zhejiang (CN); Linghan Shen, Zhejiang (CN)

(73) Assignee: HANGZHOU ZHONGGUI ELECTRONIC TECHNOLOGY CO., LTD, Zhejiang (CN)

( * ) Notice: Subject to any disclaimer, the term of this patent is extended or adjusted under 35 U.S.C. 154(b) by 476 days.

(21) Appl. No.: 17/440,191

(22) PCT Filed: Sep. 4, 2019

(86) PCT No.: PCT/CN2019/104291
§ 371 (c)(1),
(2) Date: Sep. 17, 2021

(87) PCT Pub. No.: WO2020/211260
PCT Pub. Date: Oct. 22, 2020

(65) Prior Publication Data
US 2022/0152777 A1   May 19, 2022

(30) Foreign Application Priority Data
Apr. 17, 2019   (CN) .......................... 201910309589.6

(51) Int. Cl.
*B24B 37/30* (2012.01)
*B25B 11/00* (2006.01)
(Continued)

(52) U.S. Cl.
CPC ............ *B24B 37/30* (2013.01); *B25B 11/005* (2013.01); *H01L 21/683* (2013.01); *H01L 21/68742* (2013.01)

(58) Field of Classification Search
CPC ....... B24B 37/30; B24B 37/32; B24B 37/005; H01L 21/68742; H01L 21/683
See application file for complete search history.

(56) References Cited

U.S. PATENT DOCUMENTS 6,652,362 B2 * 11/2003 Boo ........................ B24B 37/32
451/41
7,527,271 B2 * 5/2009 Oh .................... H01L 21/67005
269/21

FOREIGN PATENT DOCUMENTS

| CN | 102049730 | 5/2011 |
| CN | 104625941 | 5/2015 |

(Continued)

OTHER PUBLICATIONS

"International Search Report (Form PCT/ISA/210) of PCT/CN2019/104291", mailed on Jan. 16, 2020, with English translation thereof, pp. 1-4.

(Continued)

*Primary Examiner* — Tyrone V Hall, Jr.
(74) *Attorney, Agent, or Firm* — JCIP GLOBAL INC.

(57) ABSTRACT

Disclosed are a wafer loading bracket, a wafer loading system and a wafer mounting method. The wafer loading bracket, which can lift, and a polishing head including a plurality of pressure medium cavities are used. In a wafer loading process, arc-shaped deformation occurs, under pressure, on an attachment film of the polishing head; a wafer on a wafer-bearing base of the wafer loading bracket is lifted to a loading position, and comes into contact with the attachment film, a pressure medium cavity which is in contact with the attachment film is vacuumized; and the wafer and the (Continued)

attachment film, under vacuum conditions, are attached to the polishing head, and the wafer is transferred to the polishing head to complete loading.

7 Claims, 6 Drawing Sheets

(51) Int. Cl.
*H01L 21/683* (2006.01)
*H01L 21/687* (2006.01)

(56) References Cited

FOREIGN PATENT DOCUMENTS

| | | | | |
|---|---|---|---|---|
| CN | 109500716 | 3/2019 | | |
| CN | 110142689 | 8/2019 | | |
| EP | 922531 A1 * | 6/1999 | ............ | B24B 37/30 |
| JP | 2002346918 | 12/2002 | | |
| JP | 2003533359 | 11/2003 | | |
| KR | 20060023735 | 3/2006 | | |
| KR | 20180094409 | 8/2018 | | |

OTHER PUBLICATIONS

"Written Opinion of the International Searching Authority (Form PCT/ISA/237) of PCT/CN2019/104291", mailed on Jan. 16, 2020, pp. 1-4.
Office Action of Korean Counterpart Application, with English translation thereof, issued on May 25, 2023, pp. 1-23.

* cited by examiner

WAFER LOADING BRACKET, WAFER LOADING SYSTEM, AND WAFER MOUNTING METHOD FOR CMP PROCESS

CROSS-REFERENCE TO RELATED APPLICATION

This application is a 371 of international application of PCT application serial no. PCT/CN2019/104291, filed on Sep. 4, 2019, which claims the priority benefit of China application no. 201910309589.6, filed on Apr. 17, 2019. The entirety of each of the above mentioned patent applications is hereby incorporated by reference herein and made a part of this specification.

BACKGROUND OF THE INVENTION

1. Technical Field

The present invention relates to the equipment field of semiconductor integrated circuit chip manufacturing and in particular to a wafer loading bracket, wafer loading system and wafer mounting method.

2. Background Art

In the semiconductor integrated circuit chip manufacturing process, planarization technology has become one of the indispensable key technologies. Chemical mechanical planarization (CMP) process is the most effective and mature planarization technology at present. The CMP equipment is fully automated, which ensures the safety of every module and link in the wafer production and is of great significance for safety production, loss reduction and production efficiency improvement. The CMP equipment mainly adsorbs and loads wafers onto the polishing pad through the polishing head. After polishing, the polishing head will transport them back to the wafer loading bracket for unloading and placing.

In the process of CMP, the wafer loading of the polishing head is a very key technology. If the operation is not handled properly and relevant process parameters are not adjusted correctly, wafer loading may fail or fall off from the polishing head during loading. The falling of wafers will damage the wafers, and the equipment needs to be shut down for cleaning and maintenance. This will reduce the product yield and production efficiency. In addition, the stability of wafer loading will directly affect its polishing effect in the process of chemical mechanical polishing.

As for the wafer loading process, relatively mature models are already available in the industry. For example, in the technical solution disclosed in the U.S. Pat. No. 7,527,271B2, the loading equipment is composed of a wafer bracket and a polishing head. During operation, the central cavity in contact with the wafer is under normal pressure. The wafer is borne by the fully horizontal wafer holder on the wafer bracket, rises to contact with the adsorption film on the surface of the cavity and further rises to squeeze the cavity until it is fully in contact with the adsorption film. Then, the cavity near the edge of the wafer pressurizes and seals the contact area between the adsorption film and the wafer. After the central cavity is vacuumized and transfers the wafer to the polishing head, the cavity near the edge of the wafer is changed to the normal pressure to complete wafer loading. When the adsorption film in the central cavity produces small folds under normal pressure, the wafer and the adsorption film cannot maintain close contact, which will reduce the success rate of wafer loading. Moreover, when the wafer rises in the wafer holder and squeezes the central cavity, the lower surface of the wafer may introduce scratches, particles and other defects when squeezed by the horizontal wafer holder.

The above description shows that there is still room for optimization in the process of wafer loading from the perspective of process improvement.

SUMMARY OF THE INVENTION

The present invention discloses a wafer loading bracket, wafer loading system and wafer mounting method, which adopts a lifting wafer loading bracket and a polishing head containing multiple pressure medium cavities. In the process of wafer loading, the adsorption film of the polishing head produces arc deformation under pressure to lift the wafer on the wafer holder of the wafer loading bracket to the loading position and contact with the adsorption film. The wafer holder is composed of a basin-shaped bracket with high edge and low center. The wafer holder further lifts the wafer. Under the pressure of the wafer holder and the adsorption film, the wafer gradually attaches closely with the adsorption film from the center to the four sides, emptying the air between them. In this process, the central area of the wafer does not contact with the wafer holder, which avoids scratches on the wafer during loading. At this moment, vacuum is applied to the pressure medium cavity contacting the adsorption film, and the wafer and the adsorption film transfer the wafer to the polishing head under vacuum to complete loading. The wafer loading bracket and the pressure monitoring device in the polishing head can effectively detect the wafer loading state.

The present invention realizes the above purposes through the following technical solutions:

A wafer loading bracket comprises a base and a wafer holder located thereon. The said wafer bracket is used to place wafers, the said wafer loading bracket is matched with a polishing head loading wafers, and the said polishing head comprises the first pressure medium cavity controlling the vertical movement of the polishing head, the second pressure medium cavity keeping the cavity closed by loading pressure, the third pressure medium cavity connected with the said second pressure medium cavity and the adsorption film used to adsorb the wafer and contact with the said third pressure medium cavity. The said wafer bracket drives the said wafer to lift when the said base rises. After contacting with the said adsorption film which has produced arc deformation in the outer direction of the polishing head, the said wafer holder can be further lifted to make the said wafer attach with the said adsorption film. The said wafer holder is a basin-shaped bracket structure with high edge and low center so that during the complete contact between the said wafer and the said adsorption film, the edge of the said wafer contacts with the said wafer holder, and the central area of the said wafer does not contact with the said wafer holder, which avoids the introduction of scratches, particles and other defects on the lower surface of the wafer squeezed by the wafer holder.

Preferably, the lower part of the said wafer holder is connected with a lifting plate, and the said wafer holder continues to rise through the said lifting plate to further raise the height of the wafer. In the process of continuous lifting, the said wafer holder squeezes the said adsorption film that has produced arc deformation and increases the contact area with the wafer on the said wafer holder. At this moment, the said adsorption film produces deformation. The deformation firstly contacts with the central position of the wafer and gradually extends outward until it is in full contact with the wafer to exhaust the air between the wafers and the wafer holder.

Preferably, the lower part of the said wafer holder is connected with the upper part of the said lifting plate through several catch bolts to control the lifting of the said wafer holder.

Preferably, the lifting height of the said base is 5 mm≤Ha≤150 mm, and the lifting height of the said wafer holder is 0 mm≤Hb≤30 mm.

Preferably, the said third pressure medium cavity of the polishing head is set as one or more to adjust the air pressure in different areas and control the shape of the adsorption film of the said polishing head.

Preferably, the set pressure loaded by the said second pressure medium cavity of the said polishing head is 0.1 psi≤P2≤9.0 psi. The said third pressure medium cavity of the said polishing head is injected with gas to make the pressure value of arc deformation of the said adsorption film 0.1 psi≤P3≤8.0 psi and the pressurization time 200 ms≤t3≤8000 ms.

Preferably, after the said adsorption film of the said polishing head contacts with the wafer on the said wafer holder, the said third pressure medium cavity is changed from a pressurized state to a vacuum state, the said adsorption film and the said wafer are adsorbed to the said polishing head, and the vacuum value of the said third pressure medium cavity which is changed as a vacuum state is −9.0 psi≤Vac≤−0.1 psi.

The present invention also provides a wafer mounting method based on the wafer loading bracket as described above, which comprises the following steps:

S1. Place the wafer on the wafer holder of the wafer loading bracket;

S2. Inject gas into the third pressure medium cavity of the said polishing head to produce arc deformation of the adsorption film of the polishing head towards the outer direction of the said polishing head;

S3. Load the set pressure on the second pressure medium cavity of the polishing head and keep the cavity closed;

S4. The wafer holder loading wafers rises to the loading position with the lifting of the base, and the wafer is in contact with the said adsorption film above it;

S5. On the basis that the base lifts the wafer to the loading position, the said wafer holder can further rise and continue to lift the wafer. The said wafer holder loading wafers lifts upward to make the adsorption film produce an upward pressure, and the adsorption film is deformed. The deformation firstly contacts with the central position of the wafer and gradually extends outward until it is in full contact with the wafer to exhaust the air between the wafer and the adsorption film.

S6. The third pressure medium cavity in contact with the said adsorption film is changed from a pressurized state to a vacuum state, and the said adsorption film and the said wafer are adsorbed to the said polishing head.

Preferably, the said wafer mounting method further comprises the following steps:

S7. The following two necessary conditions shall be met in order to determine whether the loading of the wafers is successful or not: 1) The air pressure value of the second pressure medium cavity rises, which indicates that the wafer is transferred to the polishing head, and 2) the water pressure of the water pressure detection sensor of the said base decreases, which confirms that the wafer has left the base and completes loading. If the two conditions cannot be met simultaneously, it will indicate that the adsorption film is not tightly attached with the wafer or the wafer falls from the adsorption film during lifting. That is, the wafer loading fails, and the wafer loading process is cycled until the wafer loading succeeds.

The present invention also provides a wafer loading system, which comprises a polishing head loading wafers and a wafer loading bracket as described above. The said polishing head comprises: the first pressure medium cavity which controls the vertical movement of the said polishing head through pressure adjustment; the second pressure medium cavity which is loaded with a set pressure and keeps the cavity closed; one or multiple third pressure medium cavities which is or are connected with the said second pressure medium cavity through a conducting valve; an adsorption film which is used to adsorb the wafer on the wafer holder with high edge and low center. The said third pressure medium cavity contacts with the said adsorption film below it, and the state of the adsorption film is controlled by pressure adjustment. In particular, when gas is injected into the said third pressure medium cavity, the said adsorption film produces arc deformation in the outer direction of the said polishing head, the said adsorption film contacts with the wafer on the said wafer holder and changes the said third pressure medium cavity from a pressurized state to a vacuum state. The said adsorption film and the said wafer are adsorbed to the said polishing head.

Compared with the prior art, the beneficial effects of the present invention are as follows: (1) The wafer holder of the present invention is designed as a basin-shaped bracket structure with high edge and low center, which avoids the introduction of scratches, particles and other defects on the lower surface of the wafer squeezed by the wafer holder during loading, gradually attaches closely with the adsorption film from the center to the periphery and effectively empties the air between the wafers and the wafer holder; (2) The wafer loading process adopted by the present invention is more concise without a need to pressurize the wafer edge, consumes short time, obtain high efficiency and good implementation effect and ensures the success rate of the wafer in the process of loading; (3) The pressure monitoring device inside the bracket and the polishing head of the present invention can effectively detect the adsorption state of the wafer and the state of the wafer in the process of loading. That is, the judgment basis after successful wafer loading is transformed into the changes of water pressure value and air pressure value of the airtight cavity. The judgment method of the wafer state is simple, fast and highly accurate.

DETAILED DESCRIPTION OF THE INVENTION

The features, purposes and advantages of the present invention will become more obvious after you read the detailed description of the non-limiting embodiments provided with reference to FIGS. 1 to 8. Referring to FIGS. 1 to 8 showing the embodiments of the present invention, the present invention will be described in detail below. However, the present invention can be implemented in many different forms and shall not be construed as being limited by the embodiments proposed herein.

Figure 1:
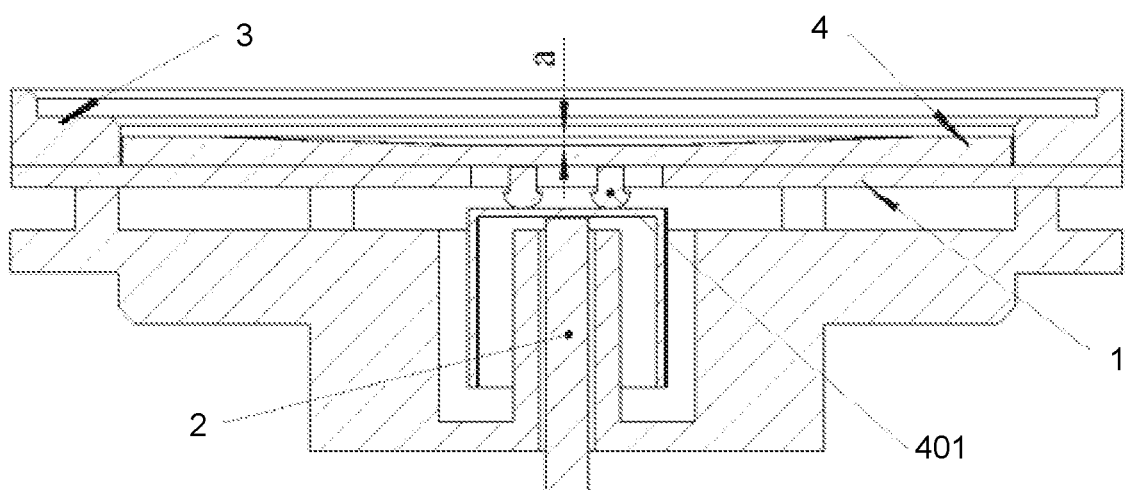
FIG. 1 is a section view for the wafer loading bracket of the present invention.
Figure 2:
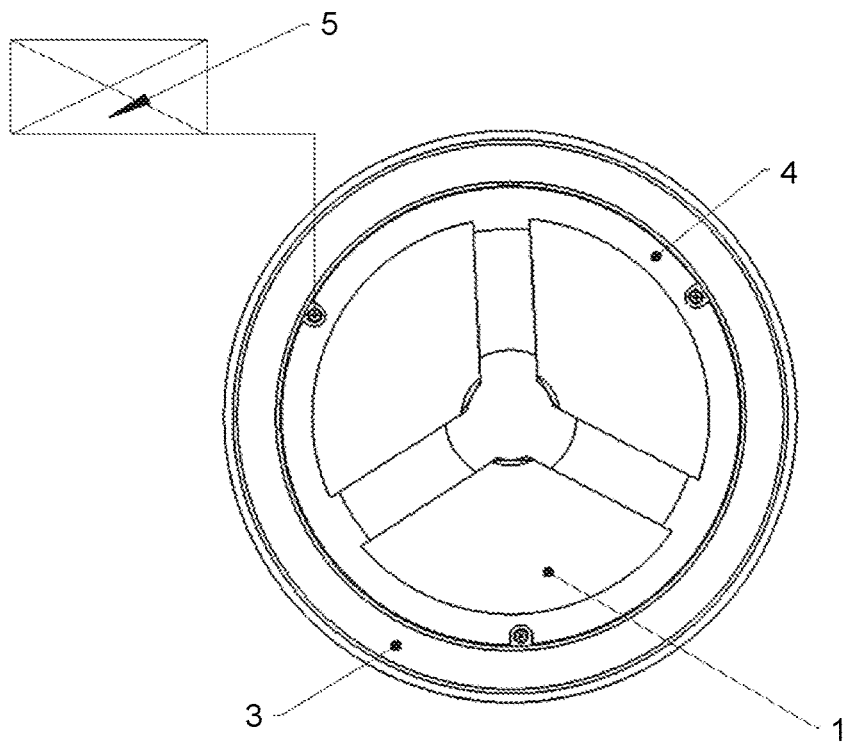
FIG. 2 is a top view for the wafer loading bracket of the present invention.

As shown in FIG. 1-FIG. 2, the wafer loading bracket of the present invention comprises a base 1, a lifting plate 2, a limit block 3 and a wafer bracket 4. The round base 1 is used to bear the limit block 3 and the wafer holder 4. The limit block 3 and the wafer holder 4 are located above the base 1, and the limit block 3 surrounds the wafer holder 4 along the edge of the wafer holder 4. The limit block 3 can ensure the accuracy of the position of the wafer 7 during loading, for the height of the wafer holder 4 at the position of the wafer 7 is slightly lower than the limit block 3 and ensures that the wafer 7 is accurately placed in the wafer holder 4.

The wafer holder 4 is composed of a basin-shaped bracket structure with high edge and low center. The lower end of the wafer holder 4 is connected with the upper end of the lifting plate 2 through several catch bolts 401 to control the lifting of the wafer holder 4 so that the wafer 7 can be further lifted at the wafer loading position. However, the present invention is not limited to connecting with the lifting plate 2 through the catch bolts 401.

As shown in FIG. 2, several deionized water nozzles are uniformly installed on the base 1 along the circumferential direction. Each deionized water nozzle is correspondingly connected with the water pressure detection sensor 5 and transmits the corresponding water pressure signal to the water pressure detection sensor 5. The present invention can detect the existence state of the wafer 7 on the wafer holder 4 in real time through the water pressure change of the water pressure detection sensor 5. Generally, the number of deionized water nozzles shall not be less than 3.

Figure 3A:
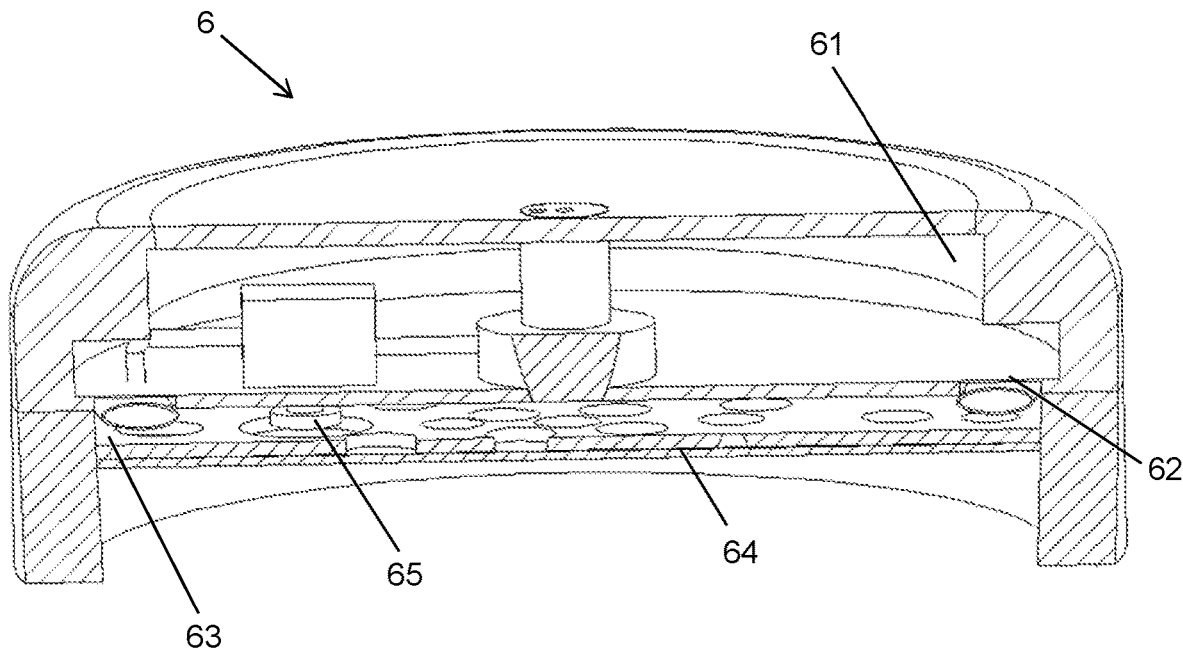
FIG. 3A is a three-dimensional structural diagram for the polishing head of the present invention.
Figure 3B:
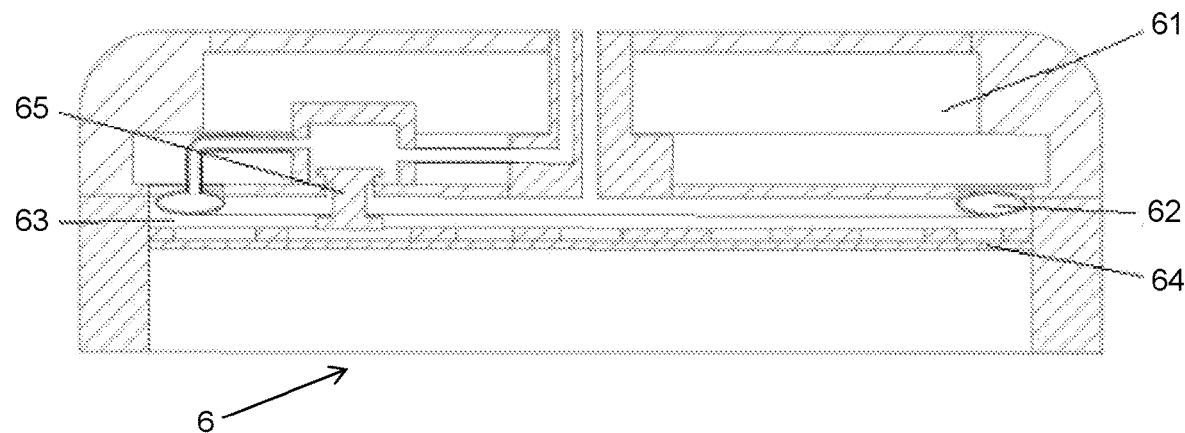
FIG. 3B is a schematic diagram for the plane structure of the polishing head of the present invention.

As shown in the combination of FIG. 3A and FIG. 3B, the polishing head 6 of the present invention comprises the first pressure medium cavity 61, the second pressure medium cavity 62, an adsorption film 64, a pressure medium cavity 63 (recorded as the third pressure medium cavity 63) in contact with the adsorption film 64, and a conducting valve 65. The first pressure medium cavity 61, the second pressure medium cavity 62, the third pressure medium cavity 63 and the adsorption film 64 are arranged from top to bottom, wherein part of the surface of the second pressure medium cavity 62 is exposed in the third pressure medium cavity 63.

The first pressure medium cavity 61 can control the vertical movement of the polishing head through pressure adjustment. Specifically, when a pressure medium (such as air) is injected into the cavity of the first pressure medium cavity 61, the first pressure medium cavity 61 expands and moves the polishing head downward. When the vacuum pumping operation is performed on the first pressure medium cavity 61, the volume of the first pressure medium cavity 61 shrinks, and the polishing head rises upward. After the wafer 7 is loaded, the first pressure medium cavity 61 is compressed, the polishing head is rotated and translated above the polishing unit, and then a pressure medium is injected into the cavity to lower the polishing head. The wafer 7 is polished on the polishing unit. After polishing, the polishing head is lifted up and rotated and translated above the wafer loading bracket to complete unloading.

The second pressure medium cavity 62 is connected with the third pressure medium cavity 63 through a conducting valve 65. In particular, the conducting valve 65 is composed of a lower partition and an upper flexible spring. After physical touch (that is, the adsorption film 64 mentioned below deforms inward under the action of vacuum), the conducting valve 65 jacks up, and the pressurized partition will compress the spring, and then the conducting valve 65 opens inward so that the two cavities (the second pressure medium cavity 62 and the third pressure medium cavity 63) are connected with each other.

The adsorption film 64 is a closed elastic film, and the state of the adsorption film 64 below the third pressure medium cavity 63 can be controlled by pressure adjustment.

The number of the third pressure medium cavities 63 of the present invention is not limited to one but can be multiple. That is, the present invention can adjust the air pressure in different areas through one or multiple third pressure medium cavities 63 and can more quickly and accurately control the deformation range and state of the adsorption film 64.

Figure 4:
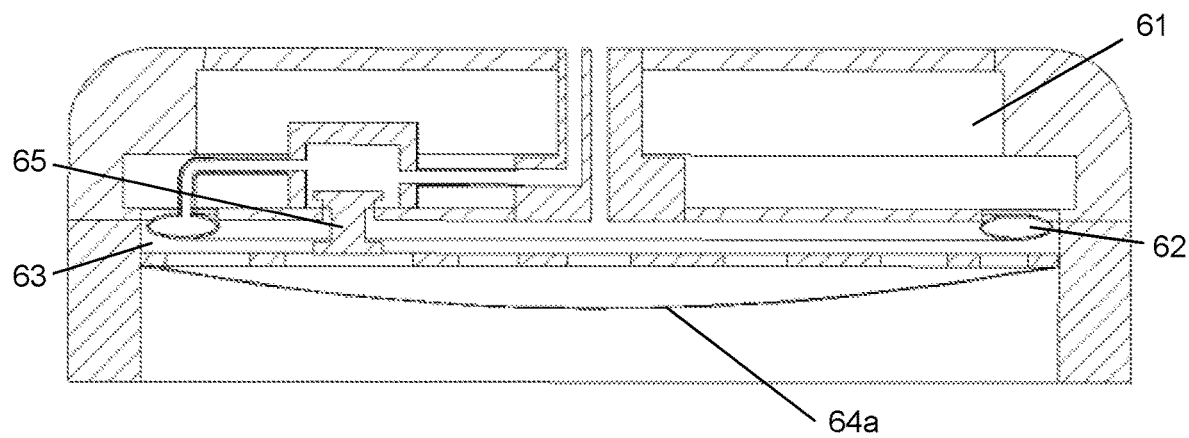
FIG. 4 is a schematic diagram for the deformation of the adsorption film of the polishing head of the present invention.

As shown in FIG. 4, when a certain amount of gas is injected into the third pressure medium cavity 63 (pressure value 0.1 psi≤P3≤8.0 psi, pressurization time 200 ms≤t3≤8000 ms), the adsorption film 64 produces some arc deformation to the outside of the polishing head 6 under the action of the pressure medium (as shown by the number mark 64a in FIG. 4). After a certain amount of gas is injected into the third pressure medium cavity 63, the air pressure of the third pressure medium cavity 63 increases and is higher than the external atmospheric pressure, the elastic adsorption film 64 is squeezed outward to form arc deformation, and then a certain pressure is loaded on the second pressure medium cavity 62 and keeps the cavity closed (for example, the pressure range is 0.1 psi≤P2≤9.0 psi).

Figure 5:
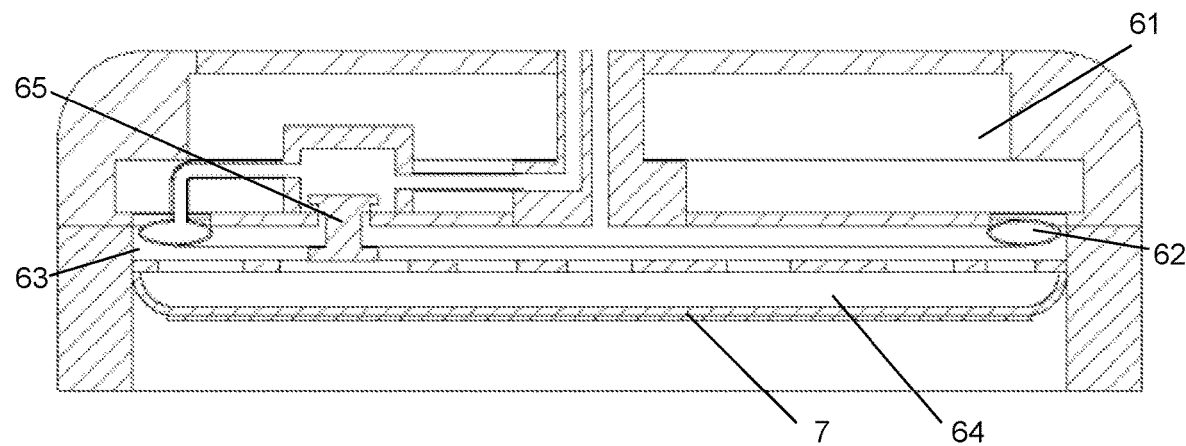
FIG. 5 is a schematic diagram for the wafer bracket lifting wafers of the present invention.

As shown in FIG. 5, the wafer 7 is placed in the wafer holder 4, the base 1 rises to drive the wafer 7 to rise (for example, the lifting height of the base is 5 mm≤Ha≤150 mm), and the raised wafer 7 will contact with the adsorption film 64 above it.

When the wafer 7 is placed in the wafer holder 4, the outlet of the deionized water nozzle on the base 1 will be normally covered by the wafer 7, the water pressure of the water pipe of the deionized water nozzle will rise, and the corresponding water pressure rising signal will be transmitted to the water pressure detection sensor 5. When the water pressure signal of each water pressure detection sensor 5 is the rising water pressure signal, it indicates that the placement position of the wafer 7 on the wafer holder 4 is correct. Otherwise, it indicates that the placement position of the wafer 7 on the wafer holder 4 is incorrect.

The wafer holder 4 continues to rise at the current height position through the lifting plate 2. That is, the height of the wafer 7 is continuously raised (for example, the lifting height of the wafer holder 4 is 0 mm≤Hb≤30 mm). The wafer holder 4 squeezes the adsorption film in the process of continuous lifting, the adsorption film 64 is subject to the downward pressure of the third pressure medium cavity 63, and the upward lifting of the wafer holder 4 produces an upward pressure on the adsorption film 64. As a result, the adsorption film 64 is squeezed, and the contact area with the wafer 7 on the wafer holder 4 is increased. At this moment, the adsorption film 64 produces some deformation under the joint action of the wafer 7 and the pressure medium. The deformation firstly contacts with the center of the wafer 7 and gradually extends outward until it is in full contact with the wafer 7. Thus, the air between the wafer 7 and the wafer holder is effectively exhausted.

In the process of full contact between the wafer 7 and the adsorption film 64, the pressure on the center of the wafer 7 is the largest and the pressure on its edge is small (the center of the wafer 7 is the largest under the downward pressure of the third pressure medium cavity 63). As the wafer holder 4 is designed as a basin-shaped bracket structure with high edge and low center, the edge position of the wafer 7 contacts with the wafer holder 4 to serve as a support, and the area with a large central pressure is not in contact with the wafer holder 4 and avoids scratch defects caused by the pressure on the lower surface of the wafer 7. Therefore, the method of and exhausting air by extending from the center to the periphery through the deformation of the adsorption film is designed reasonably, loading process is simple, there is no need to add a pressure on the edge of the wafer 7. It consumes short time, obtains high efficiency and good implementation effect and ensures the success rate of the wafer 7 in the process of loading.

Figure 6:
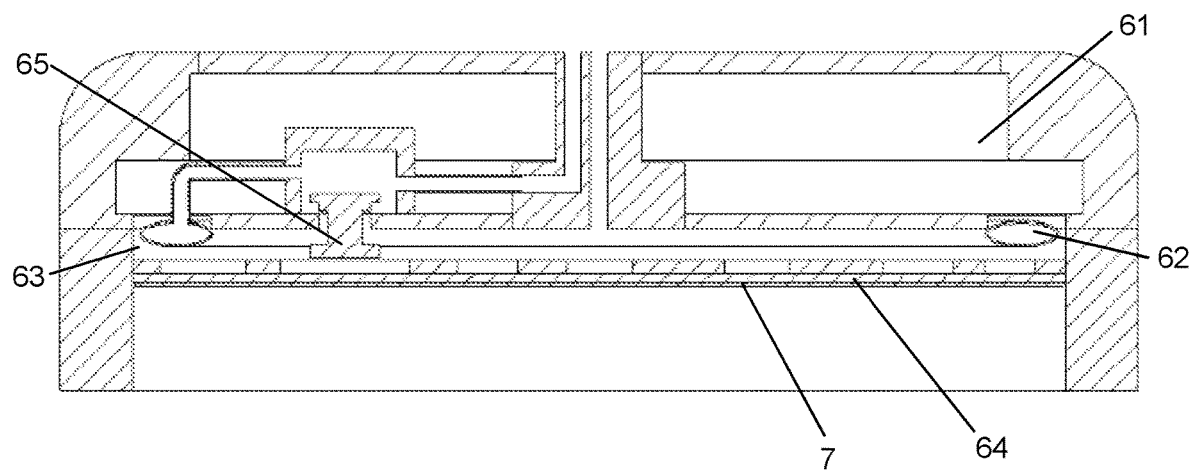
FIG. 6 is a schematic diagram for the adsorption film adsorbing wafers of the present invention.

As shown in FIG. 6, after the wafer 7 is completely covered by the adsorption film 64, the third pressure medium cavity 63 is changed from a pressurized state to a vacuum state. As the adsorption film 64 is attached with the wafer 7 completely and closely, they are adsorbed on the surface of the polishing head 6 simultaneously to complete wafer loading. At this moment, the second pressure medium cavity 62 is squeezed by the third pressure medium cavity 63 (the third pressure medium cavity 63 changes from pressurization to vacuum, and the inward deformation has the second pressure medium cavity 62 squeezed), the volume of the second pressure medium cavity 62 decreases and results in an increase in the air pressure value. This indicates that the wafer is loaded to the polishing head. Meanwhile, the wafer 7 on the wafer holder 4 is smoothly transferred to the polishing head 6, resulting in a decrease in the water pressure of the water pressure detection sensor 5 and confirming that the wafer has left the base. Therefore, the decrease of the water pressure of the water pressure detection sensor 5 and the increase of the air pressure of the second pressure medium cavity 62 are used as a basis for judging whether the wafer is loaded successfully or not. That is, if these two conditions are met, it will mean that loading is successful.

Figure 7:
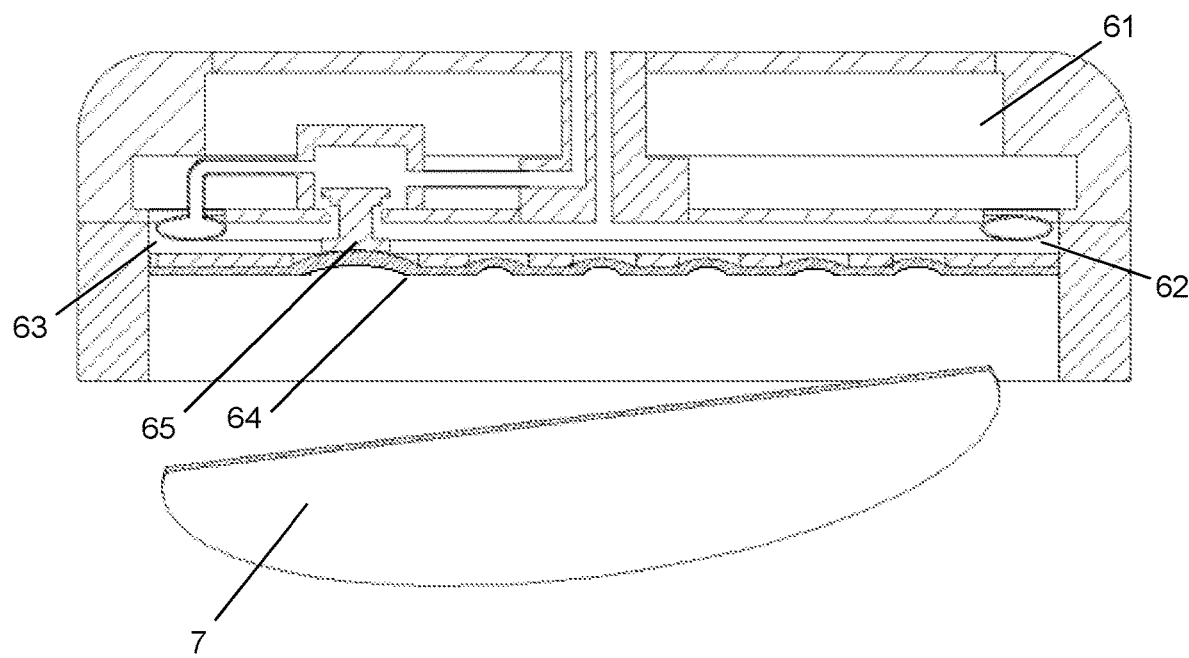
FIG. 7 is a schematic diagram for the wafer loading failure of the present invention.

As shown in FIG. 7, when the adsorption film 64 is not closely attached with the wafer 7, the wafer 7 is not adsorbed and lifted by the adsorption film 64. At this moment, the water pressure of the water pressure detection sensor 5 remains unchanged. Alternatively, when the wafer 7 falls from the adsorption film 64 during lifting, the cavity of the third pressure medium cavity 63 is changed to a vacuum state, generates a pressure difference with the external atmospheric pressure and results in the deformation of the adsorption film 64 towards the inner direction of the polishing head 6. The deformed adsorption film 64 touches the partition on the lower part of the conducting valve 65, the pressurized partition will compress the spring on the upper part of the conducting valve 65 to open the conducting valve 65 inward so that the second pressure medium cavity 62 and the third pressure medium cavity 63 are connected with each other (in order to ensure the reasonable deformation of the vacuum and atmospheric pressure difference of the third pressure medium cavity and touch the conducting valve, the vacuum value can be set as $-9.0\ psi \leq Vac \leq -0.1\ psi$), the gas in the second pressure medium cavity 62 is pumped to the vacuum state through the vacuum generator connected to the third pressure medium cavity 63. Therefore, the constant water pressure of the water pressure detection sensor 5 or the vacuum state of the second pressure medium cavity 62 can be used as a basis for judging wafer loading failure, and the state of the wafer during loading can be detected.

The facility judgment basis for judging the wafer loading state by reasonably designing the water pressure value of the water pressure detection sensor 5 and the state of the second pressure medium cavity 62 is characterized by simple and fast judgment basis, high safety and accuracy.

As shown in the combination of FIG. 3A and FIG. 3B, the inner surface of the adsorption film 64 of the present invention is closely attached to the support frame with several round holes. If the support frame does not exist, the adsorption film 64 will deform inward as a whole during vacuum operation and touch the conducting valve 65. That is, the function of the support frame is to prevent the adsorption film 64 from being adsorbed into the cavity as a whole. The round hole is set to ensure that some areas can deform inward to adsorb the wafer 7 and the inward deformation can touch the conducting valve 65 when the wafer 7 falls off.

Figure 8:
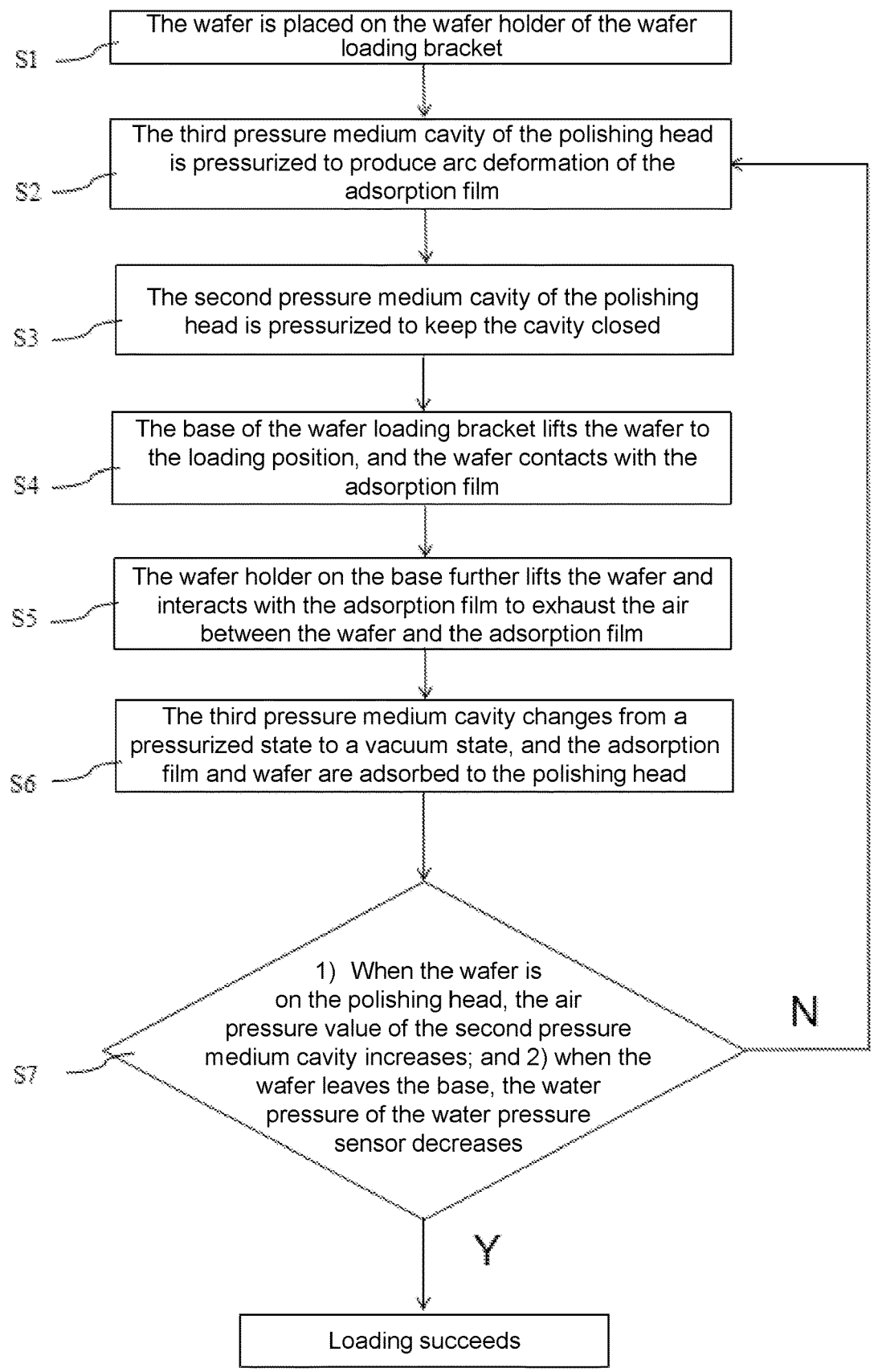
FIG. 8 is a schematic diagram for the wafer loading process of the present invention.

As shown in FIG. 8, the present invention provides a wafer mounting method, which comprises the following steps:

S1. Place the wafer on the wafer holder of the wafer loading bracket

S2. Inject gas into the third pressure medium cavity of the polishing head to produce arc deformation of the adsorption film of the polishing head towards the outer direction of the polishing head;

S3. Load the set pressure on the second pressure medium cavity of the polishing head and keep the cavity closed;

S4. The wafer holder loading wafers rises to the loading position with the lifting of the base, and the wafer is in contact with the said adsorption film above it;

S5. On the basis that the base lifts the wafer to the loading position, the wafer holder can further rise and continue to lift the wafer. The wafer holder loading wafers lifts upward to make the adsorption film produce an upward pressure, and the adsorption film is deformed. The deformation firstly contacts with the central position of the wafer and gradually extends outward until it is in full contact with the wafer to exhaust the air between the wafer and the adsorption film.

S6. The third pressure medium cavity in contact with the adsorption film is changed from a pressurized state to a vacuum state, and the adsorption film and the wafer are adsorbed to the polishing head.

S7. The following two necessary conditions shall be met in order to determine whether the loading of the wafers is successful or not: 1) The air pressure value of the second pressure medium cavity rises, which indicates that the wafer is transferred to the polishing head, and 2) the water pressure of the water pressure detection sensor of the said base decreases, which confirms that the wafer has left the base and completes loading. If the two conditions cannot be met simultaneously, it will indicate that the adsorption film is not tightly attached with the wafer or the wafer falls from the adsorption film during lifting. That is, the wafer loading fails, and it skips to Step S2 to continue until the wafer loading succeeds.

To sum up, the present invention adopts a lifting wafer loading bracket and a polishing head containing multiple pressure medium cavities. In the process of wafer loading, the adsorption film of the polishing head produces arc deformation under pressure to lift the wafer on the wafer holder of the wafer loading bracket to the loading position and contact with the adsorption film. The wafer holder is composed of a basin-shaped bracket with high edge and low center. The wafer holder further lifts the wafer. Under the pressure of the wafer holder and the adsorption film, the wafer gradually attaches closely with the adsorption film from the center to the four sides, emptying the air between them. In this process, the central area of the wafer does not contact with the wafer holder, which avoids scratches on the wafer during loading. At this moment, vacuum is applied to the pressure medium cavity contacting the adsorption film, and the wafer and the adsorption film transfer the wafer to the polishing head under vacuum to complete loading. The wafer loading bracket and the pressure monitoring device in the polishing head can effectively detect the wafer loading state.

Although the contents of the invention have been described in detail through the above preferred embodiments, we should realize that the above description shall not be considered as a limitation for the present invention. After those skilled in the art have read the above contents, various modifications and substitutions of the present invention will be obvious. Therefore, the protection range of the present invention shall be defined by the attached claims.

What is claimed is:

1. A wafer loading bracket comprises a base and a wafer holder located thereon, the wafer holder is used to place a wafer, the wafer loading bracket is matched with a polishing head for loading the wafer, and the polishing head comprises a first pressure medium cavity controlling a vertical movement of the polishing head, a second pressure medium cavity keeping the cavity closed by loading pressure, a third pressure medium cavity connected with the second pressure medium cavity and an adsorption film used to adsorb the wafer and contact with the third pressure medium cavity, wherein the wafer holder drives the wafer to lift when the base rises, and after contacting with the adsorption film which has produced arc deformation in an outer direction of the polishing head, the wafer holder may be further lifted to make the wafer attach with the adsorption film;

the wafer holder is a basin-shaped bracket structure with high edge and low center so that during a complete contact between the wafer and the adsorption film, an edge of the wafer contacts with the wafer holder, and a central area of the wafer does not contact with the wafer holder, which avoids introducing scratches and/or particles on a lower surface of the wafer caused by squeeze of the wafer holder.

2. The wafer loading bracket according to claim 1, wherein a lower part of the wafer holder is connected with a lifting plate, and the wafer holder continues to rise through the lifting plate to further raise a height of the wafer, in a process of continuous lifting, the wafer holder squeezes the adsorption film that has produced the arc deformation and increases a contact area with the wafer on the wafer holder, at this moment, the adsorption film produces deformation, the deformation first contacts a central position of the wafer and gradually extends outward until the deformation fully contact with the wafer to exhaust air between the wafers and the wafer holder.

3. The wafer loading bracket according to claim 2, wherein the lower part of the wafer holder is connected with an upper part of the lifting plate through several catch bolts to control lifting of the wafer holder.

4. The wafer loading bracket according to claim 2, wherein a lifting height of the base is 5 mm≤Ha≤150 mm, and a lifting height of the wafer holder is 0 mm≤Hb≤30 mm.

5. The wafer loading bracket according to claim 1, wherein the third pressure medium cavity of the polishing head is set as one or more to adjust air pressure in different areas and control a shape of the adsorption film of the polishing head.

6. The wafer loading bracket according to claim 1, wherein a set pressure loaded by the second pressure medium cavity of the polishing head is 0.1 psi≤P2≤9.0 psi; the third pressure medium cavity of the polishing head is injected with gas to make a pressure value of the arc deformation of the adsorption film 0.1 psi≤P3≤8.0 psi and a pressurization time 200 ms≤t3≤8000 ms.

7. The wafer loading bracket according to claim 1, wherein after the adsorption film of the polishing head contacts with the wafer on the wafer holder, the third pressure medium cavity is changed from a pressurized state to a vacuum state, the adsorption film and the wafer are adsorbed to the polishing head; a vacuum value of the third pressure medium cavity which is changed as the vacuum state is −9.0 psi≤Vac≤−0.1 psi.

* * * * *